(12) United States Patent
Kawamoto et al.

(10) Patent No.: US 8,507,922 B2
(45) Date of Patent: Aug. 13, 2013

(54) SILICON CARBIDE SUBSTRATE, SEMICONDUCTOR DEVICE, AND SOI WAFER

(75) Inventors: Satoshi Kawamoto, Okayama (JP); Masaki Nakamura, Okayama (JP)

(73) Assignees: Mitsui Engineering & Shipbuilding Co., Ltd., Tokyo (JP); Admap Inc., Okayama (JP)

( * ) Notice: Subject to any disclaimer, the term of this patent is extended or adjusted under 35 U.S.C. 154(b) by 0 days.

(21) Appl. No.: 13/808,556

(22) PCT Filed: Jul. 5, 2011

(86) PCT No.: PCT/JP2011/065342
§ 371 (c)(1),
(2), (4) Date: Jan. 4, 2013

(87) PCT Pub. No.: WO2012/005237
PCT Pub. Date: Jan. 12, 2012

(65) Prior Publication Data
US 2013/0112997 A1 May 9, 2013

(30) Foreign Application Priority Data
Jul. 6, 2010 (JP) ................................. 2010-153730

(51) Int. Cl.
*H01L 31/0312* (2006.01)
(52) U.S. Cl.
USPC ...... 257/77; 257/E21.054; 438/775; 438/931; 423/345
(58) Field of Classification Search
USPC .......................................................... 257/77
See application file for complete search history.

(56) References Cited

U.S. PATENT DOCUMENTS

| 7,022,545 | B2 * | 4/2006 | Yamada et al. | 438/105 |
| 8,088,694 | B2 * | 1/2012 | Trott | 438/791 |
| 2002/0089016 | A1 | 7/2002 | Joly et al. | |
| 2009/0263306 | A1 * | 10/2009 | Ohmi et al. | 423/345 |

FOREIGN PATENT DOCUMENTS

| JP | 2002-525839 A | 8/2002 |
| JP | 2009-260117 A | 11/2009 |

OTHER PUBLICATIONS

Jeong et al., Characterization of Undoped and Nitrogen-Doped 4H-SiC Thin Films by CVD from Bis(trimethylsilylmethane) Precursor, Journal of the Electrochemical Society, 151, 4, 2004, pp. G252-G256.*
Suttrop et al., Chemical vapor deposition and characterization of undoped and nitrogen doped single crystalline 6HSiC, Journal of Applied Physics, 72, 11, 1992, pp. 5437-5442.*

* cited by examiner

*Primary Examiner* — David Vu
*Assistant Examiner* — Earl Taylor
(74) *Attorney, Agent, or Firm* — Muncy, Geissler, Olds & Lowe, PLLC

(57) ABSTRACT

Disclosed is a silicon carbide substrate which has less high frequency loss and excellent heat dissipating characteristics. The silicon carbide substrate (S) is provided with a first silicon carbide layer (1), which is composed of a polycrystalline silicon carbide, and a second silicon carbide layer (2), which is composed of polycrystalline silicon carbide formed on the surface of the first silicon carbide layer. The second silicon carbide layer (2) has a high-frequency loss smaller than that of the first silicon carbide layer (1), the first silicon carbide layer (1) has a thermal conductivity higher than that of the second silicon carbide layer (2), and on the surface side of the second silicon carbide layer (2), the high-frequency loss at a frequency of 20 GHz is 2 dB/mm or less, and the thermal conductivity is 200 W/mK or more.

9 Claims, 2 Drawing Sheets

SILICON CARBIDE SUBSTRATE, SEMICONDUCTOR DEVICE, AND SOI WAFER

TECHNICAL FIELD

The present invention relates to a silicon carbide substrate, a semiconductor device and an SOI wafer. The invention more particularly relates to a silicon carbide substrate for mounting a semiconductor element operating in a high-frequency region, and a semiconductor device and an SOI wafer using the same.

BACKGROUND ART

Semiconductor elements operating in the high-frequency region are conventionally used in electronic devices including mobile phones and various communication equipments and various dielectric ceramics have been proposed as the substrate materials for mounting such semiconductor elements.

Of those dielectric ceramics, silicon carbide is particularly known to have high mechanical strength and stable chemical properties in combination. However, because of the large loss in the high-frequency region, silicon carbide that was used in conventional mechanical parts and the like was not suitable for the material of a substrate on which a high-frequency semiconductor element is to be mounted.

Then, for instance, Patent Literature 1 discloses a silicon carbide substrate composed of polycrystalline silicon carbide and having reduced loss in the high-frequency region by, for example, applying heat treatment.

CITATION LIST

Patent Literature

Patent Literature 1: JP 2009-260117A

SUMMARY OF INVENTION

Technical Problems

With the use of such a silicon carbide substrate, a semiconductor device having less high-frequency loss can be manufactured by mounting a semiconductor element on a surface of the silicon carbide substrate or forming an element using a silicon layer after its formation on the silicon carbide substrate through an insulating film.

However, since the silicon carbide substrate disclosed in Patent Literature 1 does not have a high thermal conductivity, sufficient heat dissipation may be hindered when a semiconductor element having a large amount of heat generation is mounted.

The silicon carbide substrate disclosed in Patent Literature 1 is also known to have high insulation properties but does not have a high thermal conductivity as described above. Therefore, this silicon carbide substrate was not suitable in cases where excellent properties are required in both of the insulation properties and thermal conductivity.

The present invention has been made to solve such prior art problems and has an object of providing a silicon carbide substrate having less high-frequency loss and exhibiting excellent heat dissipating characteristics.

Another object of the invention is to provide a silicon carbide substrate exhibiting excellent insulation properties and heat dissipating characteristics.

Still another object of the invention is to provide a semiconductor device and an SOI wafer which use such a silicon carbide substrate.

Solution to Problems

A first silicon carbide substrate according to the invention comprises: a first layer composed of polycrystalline silicon carbide; and a second layer composed of a polycrystalline silicon carbide and formed on a surface of the first layer, wherein the second layer has a less high-frequency loss than the first layer and the first layer has a higher thermal conductivity than the second layer.

Preferably, the high-frequency loss at a frequency of 20 GHz of the substrate is 2 dB/mm or less on a surface side of the second layer and the thermal conductivity of the substrate is 200 W/mK or more.

The second layer preferably has a thickness of 10 μm or more accounting for up to 20% of a total thickness of the silicon carbide substrate.

A second silicon carbide substrate according to the invention comprises: a first layer composed of polycrystalline silicon carbide; and a second layer composed of polycrystalline silicon carbide and formed on a surface of the first layer, wherein the second layer has a higher specific resistance than the first layer and the first layer has a higher thermal conductivity than the second layer.

Preferably, the specific resistance of the substrate is $10^4$ Ωcm or more on a surface side of the second layer and the thermal conductivity of the substrate is 200 W/mK or more.

In each of the first and second silicon carbide substrates, the first layer can be formed by a CVD process in an atmosphere containing nitrogen and the second layer can be formed by the CVD process in an atmosphere containing no nitrogen.

A semiconductor device according to the invention comprises the above-described silicon carbide substrate and a semiconductor element joined to a surface of the second layer of the silicon carbide substrate.

An SOI wafer according to the invention comprises: the above-described silicon carbide substrate; an insulating layer formed on a surface of the second layer of the silicon carbide substrate; and a silicon layer formed on a surface of the insulating layer.

Advantageous Effects of Invention

A silicon carbide substrate obtained according to the invention includes a first layer and a second layer each composed of polycrystalline silicon carbide and has less high-frequency loss and exhibits excellent heat dissipating characteristics because the second layer has less high-frequency loss than the first layer and the first layer has a higher thermal conductivity than the second layer.

DESCRIPTION OF EMBODIMENTS

Embodiments of the invention are described below with reference to the accompanying drawings.

Embodiment 1

Figure 1:
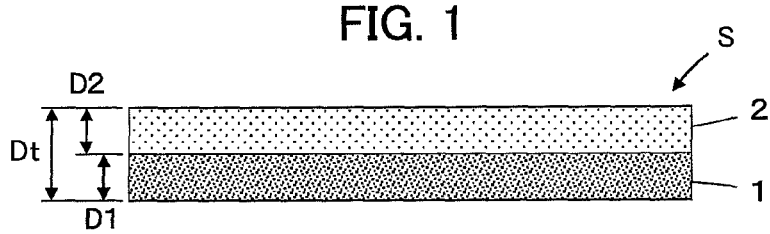
FIG. 1 is a cross-sectional view showing a silicon carbide substrate according to Embodiment 1 of the invention.

A silicon carbide substrate S according to Embodiment 1 is shown in FIG. 1. The silicon carbide substrate S is of a two-layer structure including a first silicon carbide layer 1 with a thickness D1 and a second silicon carbide layer 2 with a thickness D2 formed on a surface of the first silicon carbide layer 1. The first and second silicon carbide layers 1 and 2 are each composed of polycrystalline silicon carbide. The second silicon carbide layer 2 has less high-frequency loss than the first silicon carbide layer 1 and the first silicon carbide layer 1 has in the thickness direction a higher thermal conductivity than the second silicon carbide layer 2.

For example, the first silicon carbide layer 1 has a thermal conductivity of about 260 W/mK, whereas the second silicon carbide layer 2 has a thermal conductivity of about 100 W/mK.

With regard to the high-frequency loss at a frequency of 20 GHz, the first silicon carbide layer 1 has a value as large as about 50 dB/mm, whereas the second silicon carbide layer 2 has an extremely small value of about 1.4 to about 1.5 dB/mm.

In addition, the second silicon carbide layer 2 has a specific resistance of $10^4$ Ωcm or more.

By forming the two-layer structure including the first silicon carbide layer 1 and the second silicon carbide layer 2, the silicon carbide substrate S will have a high-frequency loss of 2 dB/mm or less at a frequency of 20 GHz on the surface side of the second silicon carbide layer 2 and a thermal conductivity of 200 W/mK or more in its thickness direction. The silicon carbide substrate S will also have a specific resistance of $10^4$ Ωcm or more on the surface side of the second silicon carbide layer 2.

The silicon carbide substrate S as described above can be fabricated as follows:

First, a graphite base material is held in a CVD apparatus, the internal pressure of the CVD apparatus is adjusted to, for example, 1.3 kPa and silicon carbide material gases including $SiCl_4$ and $C_3H_8$ are supplied into the CVD apparatus at a volume ratio of 5 to 20% together with hydrogen gas serving as a carrier gas. Nitrogen gas is further supplied at a volume ratio of 0.5 to 2.5% with respect to the material gases and heating to a temperature of, for example, 1,000 to 1,600° C. is carried out to grow silicon carbide to a predetermined thickness on the upper surface, lower surface and lateral surfaces of the graphite base material. The silicon carbide forms the first silicon carbide layer 1.

Next, after the CVD apparatus is once evacuated, the above-described formation method of the first silicon carbide layer 1 is repeated except that nitrogen gas is not supplied into the CVD apparatus, whereby silicon carbide is grown on the surfaces of the silicon carbide layer 1 to form the second silicon carbide layer 2.

The surfaces of the thus formed second silicon carbide layer 2 are subjected to mechanical polishing using, for example, a diamond abrasive. After that, the silicon carbide formed on the lateral surfaces of the graphite base material is ground and removed to obtain the graphite base material of which the upper surface and the lower surface each have the two-layer structure including the first silicon carbide layer 1 and the second silicon carbide layer 2 but the lateral surfaces are exposed.

Then, the graphite base material is heated in an oxygen atmosphere at a temperature of 900 to 1,400° C. to burn and remove the graphite base material. Two silicon carbide substrates S are thus obtained.

$SiH_4/CH_4$, $SiH_4/C_2H_4$, $SiH_4/C_3H_8$, $SiCl_4/CCl_4$, $SiCl_4/CH_4$, $CH_3SiCl_3$ and $(CH_3)_2SiCl_2$ may also be used as the material gases of silicon carbide.

In the above-described method, the first silicon carbide layer 1 was formed while supplying nitrogen gas and subsequently the second silicon carbide layer 2 was formed on the surfaces of the first silicon carbide layer 1 without supplying nitrogen gas. However, contrary to the above, it is also possible to first form the second silicon carbide layer 2 under the condition that nitrogen gas is not supplied and subsequently form the first silicon carbide layer 1 on the surfaces of the second silicon carbide layer 2 while supplying nitrogen gas.

The formation of the first silicon carbide layer 1 and the formation of the second silicon carbide layer 2 may be performed consecutively while changing the conditions on the supply of nitrogen gas or be performed in separate steps independent of each other.

Figure 2:
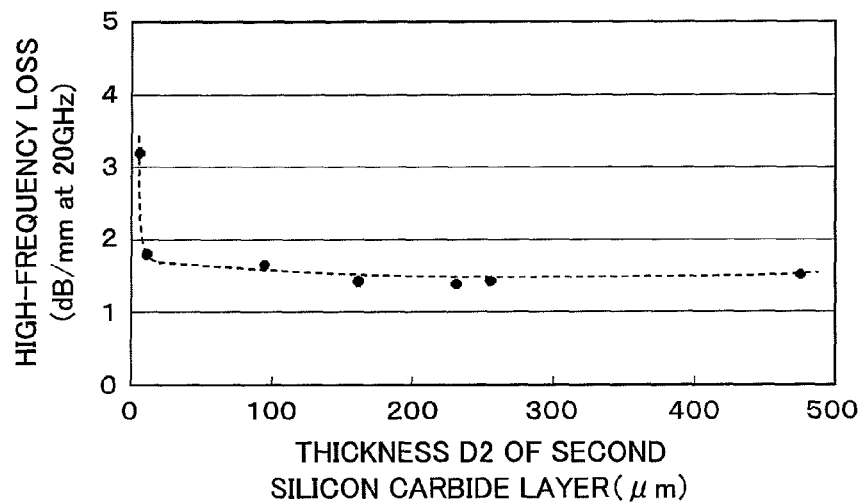
FIG. 2 is a graph showing the relation between the thickness of a second silicon carbide layer and the high-frequency loss of the whole of the silicon carbide substrate.

A plurality of silicon carbide substrates S of the two-layer structure including the first silicon carbide layer 1 and the second silicon carbide layer 2 in which the total thickness Dt was fixed to 500 μm but the thickness D2 of the second silicon carbide layer 2 was changed to various values were fabricated and the high-frequency loss at a frequency of 20 GHz on the surface side of the second silicon carbide layer 2 was measured for each of the silicon carbide substrates S. The measurement results are shown in FIG. 2.

It is found that, when the thickness D2 of the second silicon carbide layer 2 is smaller than about 10 μm, the high-frequency loss value on the surface side of the second silicon carbide layer 2 increases sharply as the thickness D2 approaches 0. This is presumably because not only the second silicon carbide layer 2 as the surface layer but also the first silicon carbide layer 1 located on the lower side of the second silicon carbide layer 2 are affected by high-frequency waves due to the small thickness of the second silicon carbide layer 2.

On the other hand, when the thickness D2 of the second silicon carbide layer 2 is 10 μm or more, the high-frequency loss on the surface side of the second silicon carbide layer 2 has a value as small as up to 2 dB/mm and the high-frequency loss on the surface side of the second silicon carbide layer 2 is stable in a range of 1.4 to 1.5 dB/mm even if the thickness D2 has a large value which may approach 500 μm.

According to the findings of the present inventors, a substrate showing a high-frequency loss of 2.0 dB/mm or less at a frequency of 20 GHz has no practical problem on the mounting of a semiconductor element operating in a high-frequency region. Therefore, the thickness D2 of the second silicon carbide layer 2 is preferably 10 μm or more.

Figure 3:
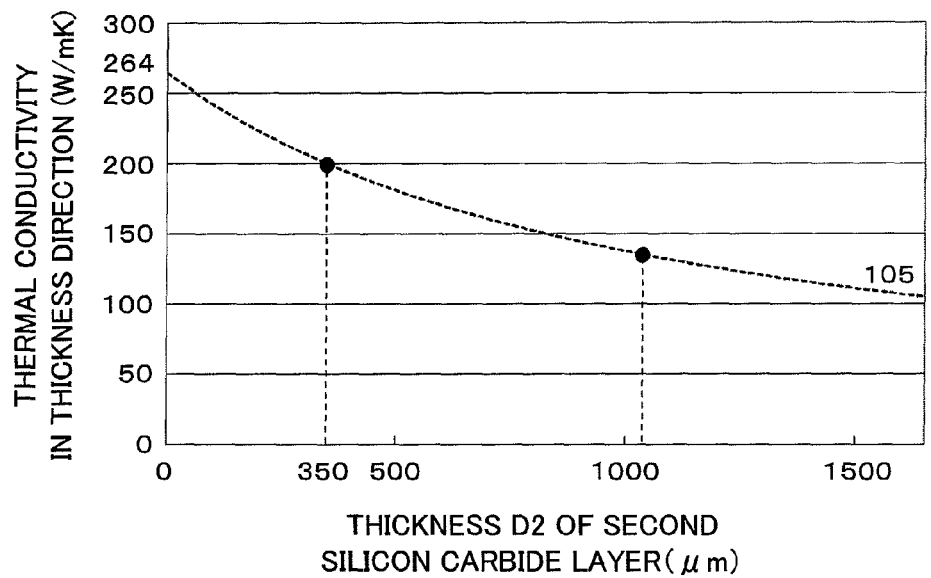
FIG. 3 is a graph showing the relation between the thickness of the second silicon carbide layer and the thermal conductivity of the whole of the silicon carbide substrate.

FIG. 3 shows a relation between the thickness D2 of the second silicon carbide layer 2 and the thermal conductivity of the whole of the silicon carbide substrate S in its thickness direction in the exemplary case where the thermal conductivity of the first silicon carbide layer 1 is 264 W/mK, that of the second silicon carbide layer 2 is about 105 W/mK and the total thickness Dt of the silicon carbide substrate S is 1,650 μm.

The thermal conductivity of the whole of the silicon carbide substrate S increases with decreasing thickness D2 of the second silicon carbide layer 2.

The inventors of the invention know that a sufficient heat-dissipating action may be achieved at a substrate thermal conductivity of 200 W/mK or more even when a semiconductor element operating in a high-frequency region is mounted.

The thickness D2 of the second silicon carbide layer 2 corresponding to the thermal conductivity of 200 W/mK that is determined from the graph of FIG. 3 is about 350 μm, which shows that the thermal conductivity of the silicon carbide substrate S has a value of 200 W/mK or more when the thickness D2 of the second silicon carbide layer 2 is about 350 μm or less. However, the thickness D2 of about 350 μm is a value obtained with respect to the total thickness Dt of the silicon carbide substrate S of 1,650 μm, and the thickness D2 of the second silicon carbide layer 2 corresponding to the thermal conductivity of 200 W/mK varies with the total thickness Dt of the silicon carbide substrate S. It seems that the thermal conductivity of the silicon carbide substrate S is determined by the ratio of the thickness D2 of the second silicon carbide layer 2 to the total thickness Dt of the silicon carbide substrate S after the thermal conductivity of each of the first silicon carbide layer 1 and the second silicon carbide layer 2 is determined. The ratio of the thickness D2 of 350 μm to the total thickness Dt of 1,650 μm is about 20%.

Therefore, in order that the silicon carbide substrate S may have a thermal conductivity of 200 W/mK or more, the thickness D2 of the second silicon carbide layer 2 is preferably up to 20% of the total thickness Dt of the silicon carbide substrate S.

In other words, in consideration of both of the high-frequency loss and the heat dissipating characteristics, the thickness D2 of the second silicon carbide layer 2 is preferably set to a value of 10 μm or more which accounts for up to 20% of the total thickness Dt of the silicon carbide substrate S.

Embodiment 2

Figure 4:
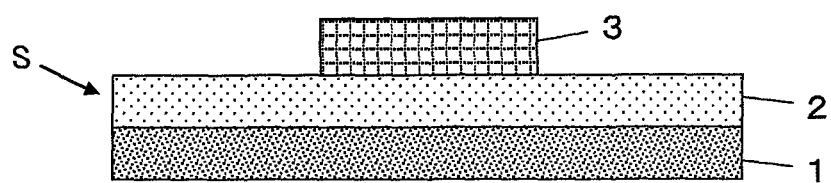
FIG. 4 is a cross-sectional view showing a semiconductor device according to Embodiment 2.

The configuration of a semiconductor device according to Embodiment 2 is shown in FIG. 4. The semiconductor device is the one having a semiconductor element 3 joined to a surface of the second silicon carbide layer 2 of the silicon carbide substrate S illustrated in Embodiment 1. The semiconductor element 3 is joined to the surface of the second silicon carbide layer 2 by, for example, brazing. It is also possible to form a predetermined conductive pattern on the surface of the second silicon carbide layer 2 and join the semiconductor element 3 onto the conductive pattern using a solder.

According to the thus configured semiconductor device, the silicon carbide substrate S has a high-frequency loss as small as up to 2 dB/mm at a frequency of 20 GHz on the side of the surface of the second silicon carbide layer 2 on which the semiconductor element 3 is to be mounted, and also has a thermal conductivity of 200 W/mK or more, and therefore enables a highly reliable and stable operation to be performed even when the semiconductor element 3 is an element operating in a high-frequency region.

In addition, since the silicon carbide substrate S has a specific resistance as high as at least $10^4$ Ocm on the surface side of the second silicon carbide layer 2, the stable operation is ensured even when the semiconductor element 3 is used to configure a circuit requiring excellent insulation properties.

Embodiment 3

Figure 5:
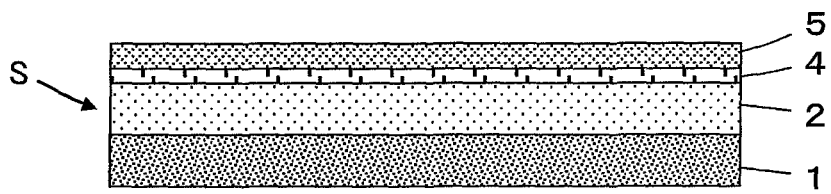
FIG. 5 is a cross-sectional view showing an SOI wafer according to Embodiment 3.

The configuration of an SOI (Silicon on Insulator) wafer according to Embodiment 3 is shown in FIG. 5. The SOI wafer is obtained by forming an insulating layer 4 composed of $SiO_2$ or the like on a surface of the second silicon carbide layer 2 of the silicon carbide substrate S illustrated in Embodiment 1 and forming a silicon layer 5 on a surface of the insulating layer 4. The silicon layer 5 is used to form circuit components.

Also in the SOI wafer, the silicon carbide substrate S has a high-frequency loss as small as up to 2 dB/mm at a frequency of 20 GHz on the surface side of the second silicon carbide layer 2 and also has a thermal conductivity of 200 W/mK or more, and therefore an apparatus capable of a highly reliable and stable operation is realized even when the silicon layer 5 is used to form an element operating in a high-frequency region.

In addition, since the silicon carbide substrate S has a specific resistance as high as at least $10^4$ Ωcm on the surface side of the second silicon carbide layer 2, the highly reliable and stable operation is possible even when the silicon layer 5 is used to configure a circuit requiring excellent insulation properties.

In addition, a high-frequency circuit board for processing microwave, millimeter-wave or other signals may also be fabricated by forming high-frequency transmission lines on the silicon carbide substrate S illustrated in Embodiment 1. The presence of the silicon carbide substrate S enables a high-frequency circuit board having reduced transmission loss of high-frequency signals to be obtained.

REFERENCE SIGNS LIST 1 first silicon carbide layer, 2 second silicon carbide layer, 3 semiconductor element, 4 insulating layer, 5 silicon layer, S silicon carbide substrate.

The invention claimed is:

1. A silicon carbide substrate for mounting an element operating in a high-frequency region on a surface thereof, said silicon carbide substrate comprising:
   a first layer composed of polycrystalline silicon carbide; and
   a second layer composed of polycrystalline silicon carbide and formed on a surface of said first layer and on the surface side of said silicon carbide substrate,
   wherein said second layer has a thickness of 10 μm or more accounting for up to 20% of a total thickness of said silicon carbide substrate and has a less high-frequency loss than said first layer, and said first layer has a higher thermal conductivity than said second layer.

2. The silicon carbide substrate according to claim 1, whose high-frequency loss at a frequency of 20 GHz is 2 dB/mm or less on a surface side of said second layer and whose thermal conductivity is 200 W/mK or more.

3. The silicon carbide substrate according to claim 1, wherein said first layer is formed by a chemical vapor deposition process in an atmosphere containing nitrogen and said second layer is formed by the chemical vapor deposition process in an atmosphere containing no nitrogen.

4. A semiconductor device comprising:
   the silicon carbide substrate according to claim 1; and
   a semiconductor element joined to a surface of said second layer of said silicon carbide substrate.

5. An SOI wafer comprising:
   the silicon carbide substrate according to claim 1;
   an insulating layer formed on a surface of said second layer of said silicon carbide substrate; and
   a silicon layer formed on a surface of said insulating layer.

6. A silicon carbide substrate for mounting an element operating in a high-frequency region on a surface thereof, said silicon carbide substrate comprising:
   a first layer composed of polycrystalline silicon carbide; and a second layer composed of polycrystalline silicon carbide and formed on a surface of said first layer and on the surface side of said silicon carbide substrate, wherein said second layer has a higher specific resistance than said first layer and said first layer has a higher thermal conductivity than said second layer, and wherein specific resistance of said silicon carbide substrate is $10^4$ Ωcm or more on a surface side of said second layer and thermal conductivity of said silicon carbide substrate is 200W/mK or more.

7. The silicon carbide substrate according to claim 6, wherein said first layer is formed by a chemical vapor deposition process in an atmosphere containing nitrogen and said second layer is formed by the chemical vapor deposition process in an atmosphere containing no nitrogen.

8. A semiconductor device comprising:
the silicon carbide substrate according to claim 6; and
a semiconductor element joined to a surface of said second layer of said silicon carbide substrate.

9. An SOI wafer comprising:
the silicon carbide substrate according to claim 6;
an insulating layer formed on a surface of said second layer of said silicon carbide substrate; and
a silicon layer formed on a surface of said insulating layer.

* * * * *